United States Patent [19]
Park et al.

[11] Patent Number: 5,989,775
[45] Date of Patent: Nov. 23, 1999

[54] COPOLYMER USEFUL FOR POSITIVE PHOTORESIST AND CHEMICAL AMPLIFICATION POSITIVE PHOTORESIST COMPOSITION COMPRISING THE SAME

[75] Inventors: Joo-Hyeon Park; Ji-Hong Kim; Ki-Dae Kim; Sun-Yi Park; Seong-Ju Kim, all of Taejeon, Rep. of Korea

[73] Assignee: Korea Kumho Petrochemical Co., Ltd., Seoul, Rep. of Korea

[21] Appl. No.: 08/998,546

[22] Filed: Dec. 26, 1997

[30] Foreign Application Priority Data

Dec. 28, 1996 [KR] Rep. of Korea .................. 96-75471

[51] Int. Cl.$^6$ ................................................. G03F 7/004
[52] U.S. Cl. ........................ 430/270.1; 430/905; 526/259; 526/313
[58] Field of Search ................. 430/270.1, 905; 526/313, 259

[56] References Cited

U.S. PATENT DOCUMENTS

| | | | |
|---|---|---|---|
| 5,334,485 | 8/1994 | Van Iseghem et al. | 526/259 |
| 5,412,050 | 5/1995 | Watanabe et al. | 526/313 |
| 5,693,452 | 12/1997 | Aoai et al. | 430/270.1 |
| 5,851,728 | 12/1998 | Kim et al. | 430/270.1 |
| 5,882,835 | 3/1999 | Park et al. | 430/170 |

*Primary Examiner*—John S. Chu
*Attorney, Agent, or Firm*—Harrison & Egbert

[57] ABSTRACT

A copolymer having a repeating unit represented by the following general formula I and a chemical amplification positive photoresist composition having the copolymer and a photoacid generator. The photoresist can allow for a good pattern shape even though a post-baking is taken in a somewhat delayed time and for a use of any radiation, such as uv light, deep uv light and charged particle beam. Also, it is superior in storage stability and resolution so that it is useful for the high integration of semiconductor devices. The polymer ranges, in polystyrene-reduced average molecular weight, from 1,000 to 1,000,000. The polymer is represented by the following repeating pattern:

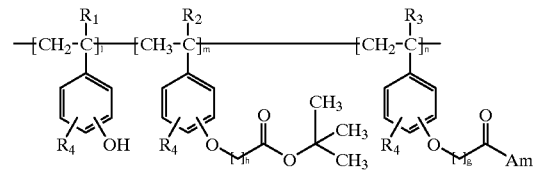

wherein, $R_1$, $R_2$ and $R_3$ independently represent a hydrogen atom or a methyl; $R_4$, $R_5$ and $R_6$ independently represent a hydrogen atom, an alkyl group, an alkoxy group or a halogen; l, m, n each is a repeating number satisfying the condition that $0.3 < l/(m+n) < 0.9$, $0.1 < m/(1+n) < 0.6$ and $0.01 < n/(1+m) < 0.5$; h and g, which may be different and the same, each are an integer of 0–8; and Am represents $NR_7R_8$, a cyclic secondary amine, or a heterocyclic secondary amine containing an oxygen or sulfur atom, wherein $R_7$ and $R_8$ independently represent a hydrogen atom, an alkyl group, an aryl group or a phenyl group.

2 Claims, No Drawings

COPOLYMER USEFUL FOR POSITIVE PHOTORESIST AND CHEMICAL AMPLIFICATION POSITIVE PHOTORESIST COMPOSITION COMPRISING THE SAME

BACKGROUND OF THE INVENTION

1. Field of the Invention

The present invention relates to a copolymer useful for positive photoresist and a chemical amplification type positive photoresist composition comprising the same. More particularly, the present invention relates to an amide-grafted polyhydroxyphenol resin and a photoresist composition which allows for a good pattern even though a post-baking process is carried out in a delayed time.

2. Description of the Prior Art

The high integration of semiconductor devices has been partly but critically based on a significant advance in lithography. For example, ultra-fine patterns as small as sub-microns or quarter-microns in size must be required for the fabrication of ultra-LSI. Accordingly, the light sources used to form the fine patterns become shorter and shorter in wavelength, for example, from g-line to i-line and deep uv light, further to KrF excimer laser, and finally to electron beams.

Since the photoresists utilizing g-line or i-line, which are largely of novolak-quinones, show large absorption peaks at the wavelength range of deep uv light and excimer laser, a fine pattern is not obtainable therefrom. Thus, there was a strong demand for a material which absorbs little of the light belonging to such wavelength ranges. In response to the demand, active research has been directed to the development of the chemical amplification photoresists based on polyhydroxystyrene derivatives, which are smaller in absorbance at such ranges than are novolak-quinonediazides.

A chemical amplification photoresist consists mainly of a base resin, a compound which generates acid upon radiation (hereinafter referred to as "photoacid generator") and a solvent dissolving them and, optionally, additives. For example, U.S. Pat. No. 4,491,628 discloses a chemical amplification photoresist employing t-butoxycarboxy-grafted polyhydroxystyrene as a base resin.

Also, there are disclosed many preparing methods for chemical amplification photoresist, including, for example, prevention of resist from being in contact with the base in the air (J. Photopolym. Sci. Technol., 8(1995) 519), post- and pre-baking at high temperatures lest the base in the air should be absorbed in a resist film (J. Photopolym. Sci, Technol., 9(1996) 557), introduction of acetal group to allow the physical and chemical properties of photoresist to change with weak acids (J. Photopolym. Sci, Technol., 9(1996) 611) and the addition of additives (J. Photopolym. Sci, Technol., 9(1996) 677).

In practice, however, satisfactory results could not obtained from the conventional resins and by the above techniques. The conventional chemical amplification photoresists are very poor in resolution and thermal resistance and, in particular, they cannot be developed into desirable patterns if a post-baking process is delayed.

SUMMARY OF THE INVENTION

The intensive and thorough research repeated by the present inventors aiming to develop a base resin for photoresist with which the above problems encountered in prior arts can be overcome, resulted in finding that, if amide groups are introduced into the polyhydroxyphenol resin, they can be used to prepare photoresists which are of high sensitivity, resolution, thermal resistance and post-exposure storage stability as well as are able to be developed into resist patterns irrespective of the kinds of substrates.

Therefore, it is an object of the present invention to provide a copolymer as a base resin for photoresist, with which there can be obtained sufficiently fine patterns for the high integration of semiconductor devices.

It is another object of the present invention to provide a chemical amplification positive photoresist composition consisting essentially of the resin and a photoacid generator.

In accordance with the present invention, the above objects could be accomplished by a provision of a copolymer having a repeating unit represented by the following general formula I:

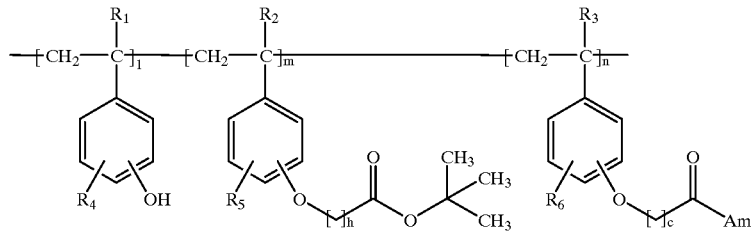

wherein, $R_1$, $R_2$ and $R_3$ independently represent a hydrogen atom or a methyl; $R_4$, $R_5$ and $R_6$ independently represent a hydrogen atom, an alkyl group, an alkoxy group or a halogen; 1, m, n each is a repeating number satisfying the condition that $0.3 < 1/(m+n) < 0.9$, $0.1 < m/(1+n) < 0.6$ and $0.01 < n/(1+m) < 0.5$; h and g, which may be different and the same, each are an integer of 0–8: and Am represents $NR_7R_8$, a cyclic secondary amine, or a heterocyclic secondary amine containing an oxygen or sulfur atom wherein $R_7$ and $R_8$ independently represent a hydrogen atom, an alkyl group, an aryl group or a phenyl group.

DETAILED DESCRIPTION OF THE INVENTION

An example of the copolymers according to the present invention can be prepared as shown in the following reaction formula:

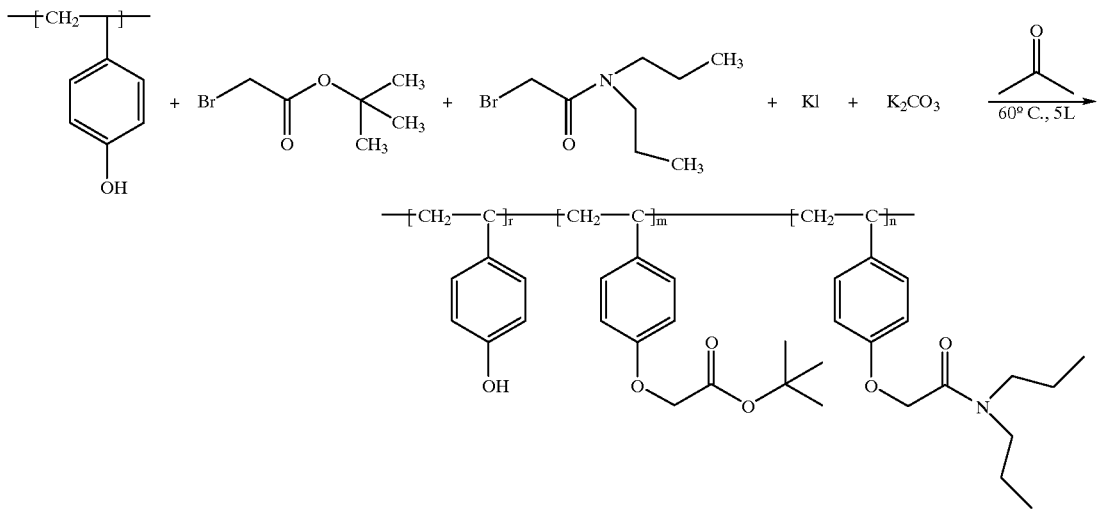

In this reaction, KI plays a role of a catalyst. It is advantageous that $K_2CO_3$ is used at a slightly greater amount than the halogen reactants. As for the solvent, it may be a highly polar acetone, alcohol, acetonitrile, dimethyl formamide or dioxane. Having a great influence on the reaction rate, the reaction temperature is preferably in a range of 60–80° C.

According to the above reaction example, the hydroxy of the phenyl group in the copolymer of Formula I is substituted by the t-butyl acetate and the amide. In the copolymer according to the present invention, the substituted t-butyl acetate is preferably in a range from approximately 1 to 50 mol % and most preferably around 30 mol % while the substituted amide is preferably in a range from approximately 1 to 30 mol % and most preferably around 10 mol %. For example, if too much acetate or amide is substituted for the hydroxy, the copolymer shows too low viscosity. On the other hand, if too little acetate or amide is present in the copolymer, the dissolution rate of the resulting photoresist shows a small difference between exposed regions and un-exposed regions.

The copolymer according to the present invention may range, in polystyrene-reduced average molecular weight, from approximately 1,000 to 1,000,000 and most preferably from approximately 5,000 to 50,000.

In the copolymer of Formula 1, the hydroxy group plays a role of improving adhesiveness, thermal resistance and sensitivity. When the copolymer is exposed to light, the t-butylacetate group is converted into a carboxylic acid which enhances the dissolution rate of the photoresist, thus resulting in the resolution. The amide group maintains the affinity for the acid generated upon the exposure, to prevent the base compounds in the air from coming into contact with the acid as well as to hinder the acid from being diffused into neighboring regions. Therefore, the amide group is not affected by the acid but stabilizes the acid.

As the photoacid generator useful in the present invention, an onium salt, such as iodonium, sulfonium, phosphonium, diazonium and pyridonium, will suffice. Concrete, but non-limiting examples of the onium salt include triphenylsulfonium triflate, diphenyl(4-methylphenyl)sulfonium triflate, diphenyl(4-t-butylphenyl) sulfonium triflate, diphenyl (4-methoxyphenyl)sulfonium triflate, triphenylsulonium hexafluoroantimonate, diphenyliodonium triflate, diphenyliodonium triflate, diphenyliodonium methylbenzenesulfonate, bis(cyclohexylsulonyl) diazomethane, and bis(2,4-dimethylphenylsulfonyl) diazomethane. An halogen compound also can be used as the photoacid generator, which is exemplified by 1,1-bis(4-chlorophenyl)-2,2,2-tricholorethane, phenyl-bis (trichloromethyl)-s-triazine or naphthyl-bis (trichloromethyl)-s-triazine. Besides, diazoketone compounds, such as 1,3-diketo-2-diazo, diazobenzoquinone and diazonaphthoquinone, sulfonic compounds, sulfonic acid compounds, and nitrobenzyl compounds may be candidates for the photoacid generator. More preferable are the onium compounds and the diazoketone compounds. The photoacid generator is used at an amount of approximately 0.1–30 parts by weight based on 100 parts by weight of the solid content of the photoresist composition, and preferably at an amount of 0.3–10 parts by weight. They may be used alone or in mixture of at least two species.

Optionally, there may be used a compound which is decomposed by acid to promote the dissolution of the photoresist in a developing solution. Examples of the acid-decomposable and dissolution-promoting compound include t-butoxycarboxyoxy- protected aromatic polyhydroxy compounds. It may be used at an amount of approximately 5–80 parts by weight based on 100 parts by weight of the solid content of the photoresist composition, and preferably at an amount of approximately 10–50 parts by weight.

The photoresist composition of the present invention may. if necessary, comprise an additive(s), such as surfactant, azo compounds, halation inhibitor, adhesive aid, preservation stabilizer and antifoaming agent. As for surfactant, it may be exemplified by polyoxylauryl ether, polyoxyethylenestearyl ether, polyoxyethyleneoleyl ether, polyoxyethyleneoctylphenol ether, polyoxyethylenoylphenol ether, polyethyleneglycol dilaurate, etc. The surfactant is preferably used at an amount of 2 parts by weight or less based on 100 parts by weight of the solid content of the photoresist composition.

Optionally, a light absorbent may be added to the photoresist composition of the present invention, in order to enhance the sensitivity or resolution thereof. Useful are benzophenones or naphthoquinones. It may be added at an amount of approximately 0.2–30% by weight on the basis of the solid content of the photoresist composition, and preferably at an amount of approximately 0.5–10% by weight.

When being exposed to light, the photoacid generator, as mentioned above, generates acid, which plays a great role in determining the sensitivity of the photoresist. In order to limit its diffusion, a base additive may be used. Amine or ammonium compounds are useful. Representative are triphenylamine and tetramethyl ammonium, respectively. It is preferable that the base compound is used at an amount of approximately 0.05–5 parts by weight on the basis of the total solid content. For example, if the base compound is added at an amount more than the upper limit, the diffusion of the acid is reduced but the sensitivity is lowered.

Appropriate evaporation rate and viscosity of solvent is required to obtain a uniform and smooth photoresist coat. Examples of such a solvent include ethyleneglycol monomethylether, ethyleneglycol monoethylether, ethyleneglycol monopropylether, ethyleneglycol monobutylether, diethyleneglycol dimethylether, diethyleneglycol diethylether, diethyleneglycol dipropylether, diethyleneglycol dibutylether, methylcellosolve acetate, propyleneglycol monomethylether acetate, propyleneglycol monoethylether acetate, propyleneglycol monopropylether acetate, methylethylketone, cyclohexanone, methyl 2-hydroxypropionate, ethyl 2-hydroxypropionate, 2-heptanone, N-methylpyrrolidone, N,N-dimethylformamide, N,N-dimethylacetamide, ethylpyruvate, n-amylacetate, ethyllactate, and gamma-butyrolactone. They, if necessary, may be used alone or in combination. Depending on its physical properties, such as volatility and viscosity, the solvent is used at such an appropriate amount that the photoresist coat is uniformly formed on a wafer.

A photoresist film is typically obtained by coating the photoresist solution on a wafer and drying it. After filtering the photoresist solution, a spin coating, flow coating or roll coating technique may be employed.

Then, the photoresist film coated is selectively irradiated, so as to give fine patterns. The available radiation, although it is not specifically limited, may be uv light, such as i-line, deep uv light, such as excimer laser, and charged particle beam, such as electron beam, and is wholly dependent on the photoacid generator used.

The final step of the formation of photoresist patten is generally carried out in a developing solution. Examples of the developing solution include aqueous solutions of sodium hydroxide, potassium hydroxide, sodium carbonate, sodium silicate, sodium metasilicate, ammonia water, ethyl amine, n-propyl amine, triethyl amine, tetramethylammonium hydroxide and tetraethylammonium hydroxide with preference to tetramethylammonium hydroxide. If necessary, additives, such as surfactants and aqueous alcohols, may be used together.

A better understanding of the present invention may be obtained in light of following examples which are set forth to illustrate, but are not to be construed to limit, the present invention.

SYNTHESIS EXAMPLE I 30 g of polyhydroxystyrene(polystyrene-reduced average molecular weight 5,300) was dissolved in 250 g of acetone and sequentially added with 12.2 g of t-butylbromoacetate, 5.2 g of potassium iodide and 12.9 g of potassium carbonate with stirring. The reaction was further stirred at 60° C. for 5 hr, cooled to room temperature and neutralized with glacial acetic acid. After the completion of the neutralization, the resin whose hydroxy group was substituted by t-butylacetate was precipitated with excess distilled water. The precipitates were washed with distilled water, dehydrated and dried and then, re-dissolved in acetone. This solution was repeatedly subjected to precipitation, washing, dehydration and drying, to produce 31 g of polyhydroxystyrene whose hydroxy was substituted at an amount of 25 mol % by t-butyl acetate: polystyrene-reduced average molecular weight 6,400.

SYNTHESIS EXAMPLE II 30 g of polyhydroxystyrene(polystyrene-reduced average molecular weight 5,300) was dissolved in 250 g of acetone and sequentially added with 12.2 g of t-butylbromoacetate, 0.56 g of N,N-dipropyl bromoacetamide, 5.4 g of potassium iodide and 13.5 g of potassium carbonate with stirring. The reaction was further stirred at 60° C. for 5 hr, cooled to room temperature and neutralized with glacial acetic acid. After the completion of the neutralization, the substituted resin was precipitated with excess distilled water. The precipitates were washed with distilled water, dehydrated and dried and then, re-dissolved in acetone. This solution was repeatedly subjected to precipitation, washing, dehydration and drying, to produce 34 g of polyhydroxystyrene whose hydroxy was substituted at an amount of 25 mol % by t-butyl acetate and 1 mol % by N,N-dipropylacetamide: polystyrene-reduced average molecular weight 6,600.

SYNTHESIS EXAMPLE III 30 g of polyhydroxystyrene(polystyrene-reduced average molecular weight 5,300) was dissolved in 250 g of acetone and sequentially added with 12.2 g of t-butylbromoacetate, 2.8 g of N,N-dipropyl bromoacetamide, 6.2 g of potassium iodide and 15.5 g of potassium carbonate with stirring. The procedure of Synthesis Example II was repeating, to produce 33 g of polyhydroxystyrene whose hydroxy was substituted at an amount of 25 mol % by t-butyl acetate and 5 mol % by N,N-dipropylacetamide: polystyrene-reduced average molecular weight 6,800.

SYNTHESIS EXAMPLE IV 30 g of polyhydroxystyrene(polystyrene-reduced average molecular weight 5,300) was dissolved in 250 g of acetone and sequentially added with 12.2 g of t-butylbromoacetate, 5.6 g of N,N-dipropyl bromoacetamide, 7.3 g of potassium iodide and 18.1 g of potassium carbonate with stirring. The procedure of Synthesis Example II was repeating, to produce 38 g of polyhydroxystyrene whose hydroxy was substituted at an amount of 25 mol % by t-butyl acetate and 10 mol % by N,N-dipropylacetamide: polystyrene-reduced average molecular weight 7,100.

SYNTHESIS EXAMPLE V

The procedure of Synthesis Example II was repeated using 0.52 g of 4-morphornyl bromoacetate instead of 0.56 g of N,N-dipropyl bromoacetamid, to produce 30 g of polyhydroxystyrene whose hydroxy was substituted at an amount of 25 mol % by t-butyl acetate and 1 mol % by 4-morphornyl acetate: polystyrene-reduced average molecular weight 6,500.

SYNTHESIS EXAMPLE VI

The procedure of Synthesis Example III was repeated using 2.6 g of 4-morphornyl bromoacetate instead of 2.8 g of N,N-dipropyl bromoacetamid, to produce 33 g of polyhydroxystyrene whose hydroxy was substituted at an amount of 25 mol % by t-butyl acetate and 5 mol % by 4-morphornyl acetate: polystyrene-reduced average molecular weight 6,800.

SYNTHESIS EXAMPLE VII

The procedure of Synthesis Example IV was repeated using 5.2 g of 4-morphornyl bromoacetate instead of 5.6 g of N,N-dipropyl bromoacetamid, to produce 37 g of polyhydroxystyrene whose hydroxy was substituted at an amount of 25 mol % by t-butyl acetate and 10 mol % by 4-morphornyl acetate: polystyrene-reduced average molecular weight 7,100.

EXAMPLE I 100 weight parts of the polyhydroxystyrene obtained in Synthesis Example II, whose hydroxy was 25 mol % substituted by t-butyl acetate and 1 mol % substituted by N,N-dipropyl acetamide and 0.8 weight parts of triphenylsulfonium triflate were dissolved in 350 weight parts of ethyl lactate. The solution was filtered through a filter having a pore size of 0.1 μm, to give a positive photoresist solution.

This was coated on a silicon wafer with the aid of a spinner and the coat was dried at 130° C. for 60 sec to give a resist film 0.7 μm thick. It was exposed through a pattern chrome mask to a KrF excimer laser of 248 nm in a steper. After the exposure, the film was baked at 130° C. for 60 sec.

A developing process was carried out with the wafer for 60 sec in a 2.38 wt % tetramethylammonium hydroxide solution in water and drying it, to form a line-and-space resist pattern 0.4 μm wide.

This resolution was obtained at an exposure energy of 25 mJ/cm$^2$ and the upper part of the pattern was roundish but almost rectangular in cross sectional shape.

When the post-baking was carried out at 130° C. for 60 sec after one hour of the exposure, the resulting line-and-space pattern was found to be of T-shape in cross section and have a minimal resolution of 0.50 μm.

EXAMPLE II

The procedure of Example I was repeated using 100 weight parts of the polyhydroxystyrene obtained in Synthesis Example III, whose hydroxy was 25 mol % substituted by t-butyl acetate and 5 mol % substituted by N,N-dipropyl acetamide, to form a resist pattern.

The pattern obtained was found to have a good cross section 0.25 μm thick at an exposure energy of 30 mJ/cm$^2$ as observed with an electron microscope. The upper part of the pattern was good rectangular in cross sectional shape.

EXAMPLE III

The procedure of Example I was repeated using 100 weight parts of the polyhydroxystyrene obtained in Synthesis Example IV, whose hydroxy was 25 mol % substituted by t-butyl acetate and 10 mol % substituted by N,N-dipropyl acetamide, to form a resist pattern.

The pattern obtained was found to have a good cross section 0.30 μm thick at an exposure energy of 48 mJ/cm$^2$ as observed with an electron microscope. The upper part of the pattern was almost rectangular in cross sectional shape.

EXAMPLE IV

The procedure of Example II was repeated using 1.3 weight parts of diphenyl(4-methoxyphenyl)sulfonium triflate instead of 0.8 parts of triphenylsulfonium triflate, to form a resist pattern.

The pattern obtained was found to have a good cross section 0.30 μm thick at an exposure energy of 23 mJ/cm$^2$ as observed with an electron microscope. The upper part of the pattern was good rectangular in cross sectional shape.

EXAMPLE V

The procedure of Example IV was repeated using 1.5 weight parts of bis(cyclohexylsufonyl)diazomethane instead of 1.3 parts of diphenyl(4-methoxyphenyl)sulfonium triflate, to form a resist pattern.

The pattern obtained was found to have a good cross section 0.35 μm thick at an exposure energy of 65 mJ/cm$^2$ as observed with an electron microscope. The upper part of the pattern was almost rectangular in cross sectional shape.

EXAMPLE VI 100 weight parts of the polyhydroxystyrene obtained in Synthesis Example III, whose hydroxy was 25 mol % substituted by t-butyl acetate and 1 mol % substituted by N,N-dipropyl acetamide and 2.5 weight parts of triphenylsulfonium triflate were dissolved in 350 weight parts of ethyl lactate. The procedure of Example I was repeated adding 40 mol % of tetramethylamonium hydroxide to photoacid generator was added in resist solution.

The pattern obtained was found to have a good cross section 0.25 μm thick at an exposure energy of 40 mJ/cm$^2$ as observed with an electron microscope. The upper part of the pattern was good rectangular in cross sectional shape.

When the post-baking was carried out at 130° C. for 60 sec after one hour of the exposure, the resulting line-and-space pattern was have to good rectangular in cross sectional shape and have a resolution of 0.25 μm.

EXAMPLE VII 100 weight parts of the polyhydroxystyrene obtained in Synthesis Example III, whose hydroxy was 25 mol % substituted by t-butyl acetate and 5 mol % substituted by N,N-dipropyl acetamide and 2.2 weight parts of triphenylsulfonium triflate were dissolved in 330 weight parts of ethyl lactate. The procedure of Example I was repeated adding 20 mol % of tetramethylamonium hydroxide to photoacid generator was added in resist solution.

The pattern obtained was found to have a good cross section 0.35 μm thick at an exposure energy of 36 mJ/cm$^2$ as observed with an electron microscope. The upper part of the pattern was good rectangular in cross sectional shape.

EXAMPLE VIII 100 weight parts of the polyhydroxystyrene obtained in Synthesis Example V, whose hydroxy was 25 mol % substituted by t-butyl acetate and 1 mol % substituted by 4-morphornyl acetate and 1.0 weight parts of triphenylsulfonium triflate were dissolved in 350 weight parts of ethyl lactate. The solution was filtered through a filter having a pore size of 0.1 μm to give a positive photoresist solution.

This was coated on a silicon wafer with the aid of a spinner and the coat was dried at 120° C. for 60 sec to give a resist film 0.7 μm thick. It was exposed through a pattern chrome mask to a KrF excimer laser of 248 nm in a steper. After the exposure, the film was baked at 130° C. for 60 sec.

A developing process was carried out with the wafer for 60 sec in a 2.38 wt % tetramethylammonium hydroxide solution in water and drying it, to form a resist pattern 0.35 an wide.

This resolution was obtained at an exposure energy of 28 mJ/cm$^2$ and the upper part of the pattern was roundish but almost rectangular in cross sectional shape.

When the post-baking was carried out at 130° C. for 60 sec after one hour of the exposure, the resulting line-and-space pattern was found to be of T-shape in cross section and have a minimal resolution of 0.44 μm.

EXAMPLE IX 100 weight parts of the polyhydroxystyrene obtained in Synthesis Example V, whose hydroxy was 25 mol % substituted by t-butyl acetate and 1 mol % substituted by 4-morphornyl acetate and 3.0 weight parts of triphenylsulfonium triflate were dissolved in 330 weight parts of ethyl lactate. The procedure of Example VIII was repeated adding 50 mol % of tetramethylamonium hydroxide to photoacid generator was added in resist solution.

The pattern obtained was found to have a good cross section 0.22 µm thick at an exposure energy of 46 mJ/cm² as observed with an electron microscope. The upper part of the pattern was good rectangular in cross sectional shape.

EXAMPLE X

The procedure of Example VIII was repeated using 100 weight parts of the polyhydroxystyrene obtained in Synthesis Example VI, whose hydroxy was 25 mol % substituted by t-butyl acetate and 5 mol % substituted by 4-morphornyl acetate.

The pattern obtained was found to have a good cross section 0.20 µm thick at an exposure energy of 30 mJ/cm² as observed with an electron microscope. The upper part of the pattern was good rectangular in cross sectional shape.

EXAMPLE XI 100 weight parts of the polyhydroxystyrene obtained in Synthesis Example VI, whose hydroxy was 25 mol % substituted by t-butyl acetate and 5 mol % substituted by 4-morphornyl acetate and 2.5 weight parts of triphenylsulfonium triflate were dissolved in 330 weight parts of ethyl lactate. The procedure of Example VIII was repeated adding 30 mol % of tetramethylamonium hydroxide to photoacid generator was added in resist solution.

The pattern obtained was found to have a good cross section 0.175 µm thick at an exposure energy of 57 mJ/cm² as observed with an electron microscope. The upper part of the pattern was good rectangular in cross sectional shape.

When the post-baking was carried out at 130° C. for 60 sec after one hour of the exposure, the resulting line-and-space pattern was found to be of rectangular-shape in cross section and have a resolution of 0.175 µm.

EXAMPLE XII

The procedure of Example VIII was repeated using 1.5 weight parts of diphenyl(4-methoxyphenyl)sulfonium triflate instead of 1.0 weight parts of triphenylsulfonium triflate in Example X.

The pattern obtained was found to have a good cross section 0.2 µm thick at an exposure energy of 45 mJ/cm² as observed with an electron microscope. The upper part of the pattern was good rectangular in cross sectional shape.

EXAMPLE XIII

The procedure of Example VIII was repeated using 1.8 weight parts of bis(cyclohexylsufonyl)diazomethane instead of 1.5 weight parts of diphenylsulfonium triflate in Example XII.

The pattern obtained was found to have a good cross section 0.30 µm thick at an exposure energy of 58 mJ/cm² as observed with an electron microscope. The upper part of the pattern was almost rectangular in cross sectional shape.

EXAMPLE XIV

The procedure of Example VIII was repeated using 100 weight parts of the polyhydroxystyrene obtained in Synthesis Example VII, whose hydroxy was 25 mol % substituted by t-butyl acetate and 10 mol % substituted by 4-morphornyl acetate.

The pattern obtained was found to have a good cross section 0.25 µm thick at an exposure energy of 35 mJ/cm² as observed with an electron microscope. The upper part of the pattern was almost rectangular in cross sectional shape.

Comparative Example I 100 weight parts of the polyhydroxystyrene whose hydroxy was substituted 25 mol % by t-butyl acetate and 0.8 weight parts of triphenylsulfonium triflate were dissolved in 350 weight parts of ethyl lactate. This solution was filtered through a 0.1 µm membrane filter, to give a positive resist solution.

A line-and-space pattern was formed from this positive resist solution in the same procedure with Example I. It has a poor cross section of T shape and its resolution was 0.48 µm at maximum.

As described hereinbefore, the positive photoresist of the present invention can allow for a good pattern shape even though the post-baking is delayed in a certain time. Also, the positive photoresist can allow any radiation, including uv light, deep uv light and charged particle beam, such as i-line, excimer laser and electron beam, to be used and is superior in storage stability and resolution so that it is useful for the high integration of semiconductor devices.

The present invention has been described in an illustrative manner, and it is to be understood the terminology used is intended to be in the nature of description rather than of limitation.

Many modifications and variations of the present invention are possible in light of the above teachings.

Therefore, it is to be understood that within the scope of the appended claims, the invention may be practiced otherwise than as specifically described.

What is claimed is:

1. A polymer ranging, in polystyrene-reduced average molecular weight, from approximately 1,000 to 1,000,000, represented by the following the following general formula I:

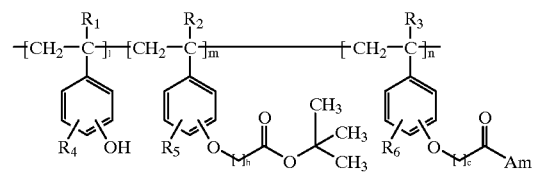

wherein, $R_1$, $R_2$ and $R_3$ independently represent a hydrogen atom or a methyl;

$R_4$, $R_5$ and $R_6$ independently represent a hydrogen atom, an alkyl group, an alkoxy group or a halogen;

l, m, n each is a repeating number satisfying the condition that $0.3 < l/(m+n) < 0.9$, $0.1 < m/(l+n) < 0.6$ and $0.01 < n/(l+m) < 0.5$;

h and g, which may be different and the same, each are an integer of 0–8; and

Am represents $NR_7R_8$, a cyclic secondary amine, or a heterocyclic secondary amine containing an oxygen or sulfur atom, wherein $R_7$ and $R_8$ independently represent a hydrogen atom, an alkyl group, an aryl group or a phenyl group.

2. A chemical amplification positive photoresist composition comprising a polymer represented by the following general formula I:

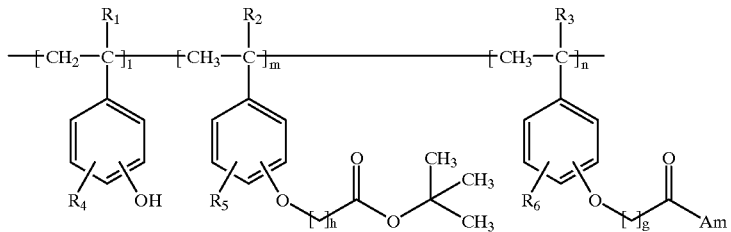

wherein, $R_1$, $R_2$ and $R_3$ independently represent a hydrogen atom or a methyl; $R_4$, $R_5$ and $R_6$ independently represent a hydrogen atom, an alkyl group, an alkoxy group or a halogen; l, m, n each is a repeating number satisfying the condition that $0.3 < l/(m+n) < 0.9$, $0.1 < m/(l+n) < 0.6$ and $0.01 < n/(l+m) < 0.5$; h and g, which may be different and the same, each are an integer of 0–8; and Am represents $NR_7R_8$, a cyclic secondary amine, or a heterocyclic secondary amine containing an oxygen or sulfur atom, wherein $R_7$ and $R_8$ independently represent a hydrogen atom, an alkyl group, an aryl group or a phenyl group, and a photoacid generator able to generate acid upon radiation.

* * * * *